(12) United States Patent
Such et al.

(10) Patent No.: US 6,477,679 B1
(45) Date of Patent: Nov. 5, 2002

(54) METHODS FOR DECODING DATA IN DIGITAL COMMUNICATION SYSTEMS

(75) Inventors: Paula F. Such, Austin, TX (US); Dana J. Taipale, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/499,402

(22) Filed: Feb. 7, 2000

(51) Int. Cl.[7] .............................................. H03M 13/00
(52) U.S. Cl. ..................................................... 714/755
(58) Field of Search ................................ 714/786, 796, 714/755; 375/265

(56) References Cited

U.S. PATENT DOCUMENTS 6,044,116 A * 3/2000 Wang .......................... 375/265

FOREIGN PATENT DOCUMENTS

AT          1022860 A1 * 7/2000 .......... H03M/13/29

OTHER PUBLICATIONS

Barbulescu et al., Turbo codes: a tutorial on a new class of powerful error correcting coding schemes, Institute for Telecommunications Research, pg. 1 to 21, Oct. 1998.*
Gracie et al., performance of a low–complexity Turbo decoder and its implementation on a low–cost, 16–bit fixed–point DSP, Communication Research Centre, pg. 1–11, Jul. 1998.*
Sklar, "A Primer on Turbo Code Concepts," IEEE, pp. 94–102 (1997).
"European Transactions on Telecommunications," AEI, ETT vol. 8, No. 2, pp. 119–125 (1997).
Benedetto et al., "Design of Parallel Concatenated Convolutional Codes," IEEE, pp. 591–600 (1996).
Berrou et al., "Near Optimum Error Correcting Coding and Decoding: Turbo–Codes," IEEE, pp. 1261–1271 (1996).
Berrou et al., "Near Shannon Limit Error –Correcting Coding and Decoding: Turbo–Codes (1)," IEEE, pp. 1064–1070 (1993).
Bahl et al., "Optimal Decoding of Linear Codes for Minimizing Symbol Error Rate," IEEE, pp. 284–287 (1974).
Viterbi, "Error Bounds for Convolutional Codes and an Asymptotically Optimum Decoding Algortihm," IEEE, pp. 260–269 (1966).

* cited by examiner

*Primary Examiner*—Albert Decady
*Assistant Examiner*—Shelly A Chase
(74) *Attorney, Agent, or Firm*—Joanna G. Chiu

(57) ABSTRACT

In a decoding system having a first constituent decoder and a second constituent decoder, a sequence of inputs that includes a system input, a first parity input, and a second parity input, is decoded. The first constituent decoder receives a feedback input and the first parity input, and based on these inputs, the first constituent decoder produces a first constituent decoder output. The output of the first constituent decoder is modified to obtain a first combined feedback and system input, thereby including a statistical dependency. The second constituent decoder receives this combined input and the second parity input and based on these inputs, produces a second constituent decoder output. The second constituent decoder output is processed to produce decoded bits. Embodiments further include modifying the output of the second constituent decoder and providing the modified output as the feedback to the first constituent decoder.

6 Claims, 3 Drawing Sheets

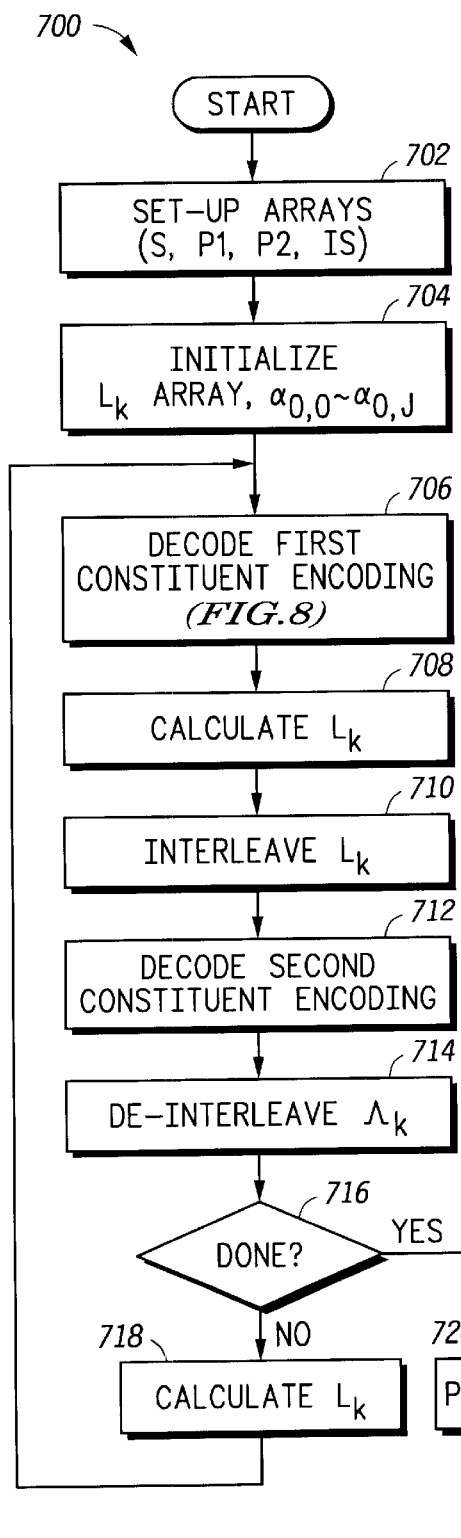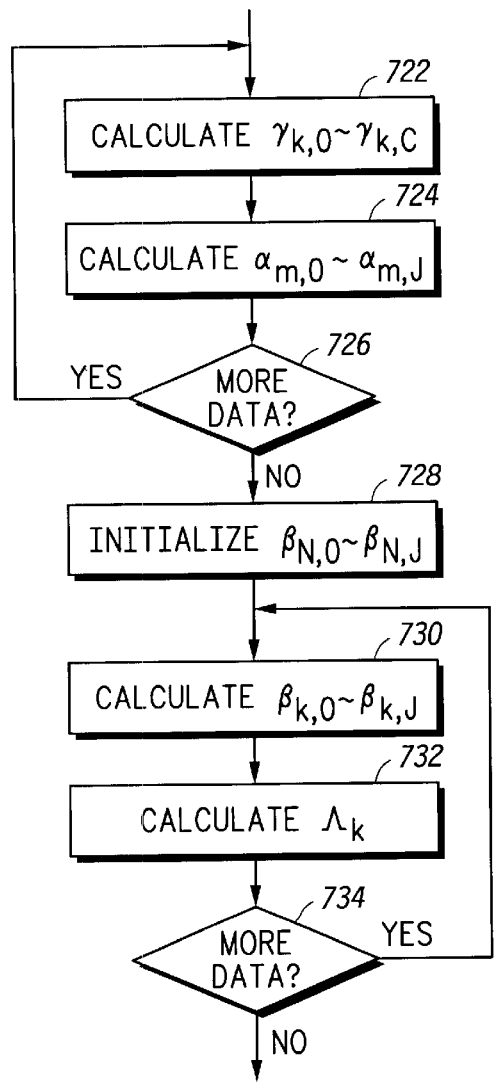
FIG. 7
FIG. 8

METHODS FOR DECODING DATA IN DIGITAL COMMUNICATION SYSTEMS

RELATED APPLICATION

This is related to Taipale et al., application Ser. No. 09/498,852, entitled "Methods for decoding data in digital communication systems," filed concurrently herewith, and is incorporated herein by reference and assigned to the current assignee hereof.

FIELD OF THE INVENTION

This invention relates generally to communications systems. More specifically, the present invention relates to methods for decoding data in digital communications systems.

RELATED ART

FIG. 1 depicts a block diagram of a parallel concatenated recursive systematic convolutional coder 100 known in the art. Coder 100 falls into the class of coders known as "turbo coders." Coder 100 includes a first constituent encoder 102, a second constituent encoder 104, a multiplexer 106, and a buffer interleaver 110. Data to be encoded by coder 100 is input to multiplexer 106 and to buffer interleaver 110. An output of multiplexer 106 is input to a recursive convolutional encoder 108. Similarly, an output of buffer interleaver 110 is input to a recursive convolutional encoder 108'. An INTERMEDIATE OUTPUT of recursive convolutional encoder 108 is also input to multiplexer 106. A control signal, "TERMINATION CONTROL," selects which input of multiplexer 106 is output to convolutional encoder 108 and to a systematic first-in-first-out queue ("FIFO") 112. An output of systematic FIFO 112 generates a first one of four outputs of coder 100, SYSTEMATIC-1. An ENCODER OUTPUT is input to a parity first-in-first-out queue ("FIFO") 114. An output of parity FIFO 114 generates a second one of four outputs of coder 100, PARITY-1.

Continuing with recursive convolutional encoder 108, the output of multiplexer 106 is input to an input of an exclusive OR (XOR) gate 116. A second input of XOR gate 116 receives the INTERMEDIATE OUTPUT of recursive convolutional encoder 108. An output of XOR gate 116 is input to a first bit latch 118. An output of bit latch 118 is input to a second bit latch 120. An output of bit latch 120 is input to an XOR gate 122 and to an XOR gate 124. A second input of XOR gate 122 receives the output of XOR gate 116. A second input of XOR gate 124 receives the output of bit latch 118. An output of XOR gate 124 generates the INTERMEDIATE OUTPUT of recursive convolutional encoder 108.

Continuing with recursive convolutional encoder 108', the output of buffer interleaver 110 generates a third one of four outputs of coder 100, SYSTEMATIC-2. In one embodiment of coder 100, recursive convolutional encoder 108' is identical to recursive convolutional encoder 108. In this case, the final output of coder 100, PARITY-2, is generated by an XOR gate 122' (not shown). As described below, recursive convolutional encoder 108' may differ from recursive convolutional encoder 108.

Continuing with the operation of coder 100, a data stream to be encoded is input to both recursive convolutional encoders. These encoders create redundant information (PARITY-1, PARITY-2) that is transmitted in addition to the original data stream (SYSTEMATIC-1, SYSTEMATIC-2). Buffer interleaver 110 reorders the input data stream prior to the operation of encoder 108'.

Later, a decoder receiving the data stream uses the systematic and parity data to recreate the most likely original data stream based on the polynomials instantiated in the recursive convolutional encoders. Known methods of decoding turbo coded data streams have at least two disadvantages.

First, the calculation of a possible data stream from its parity and systematic data streams is dependent upon the starting state of the recursive convolutional encoders used by the coder. In a turbo coding scheme, these calculations are made in a forward direction (first data bit to last data bit) and in a backwards direction (last data bit to first data bit) to improve the accuracy of the output. Both of these calculations require knowledge of the initial (or final) state of the recursive convolutional encoders. Otherwise, the accuracy of the data stream will be limited during the initial (or final) bit calculations. In the prior art, it is known to initially set the recursive convolutional encoders to a known state. This scheme addresses the forward calculation problem. However, the determination of the final state is more difficult. Multiplexer 106 may be used to input predetermined data into recursive convolutional encoder 108 after processing the data stream. This data forces the encoder to a final known state. Unfortunately, buffer interleaver 110 rearranges these bits in the data stream prior to input to encoder 108'. Consequently, encoder 108' ignores these final inputs. Encoder 108' may include a multiplexer 106' (not shown) analogous to multiplexer 106 to force the final state of recursive convolutional encoder 108' to a known state. This latter approach requires that additional systematic and parity data be sent to the encoder from encoder 108' and that this data be processed by the decoder.

Second, a turbo coding scheme decodes a block of data by iteratively processing the data through two sequential maximum-a-posteriori ("MAP") decoders. The data is interleaved between the two sequential MAP decoders to reflect the effect of buffer interleaver 110. During each iteration, one MAP decoder uses a soft decision (intermediate guess) of the other MAP decoder in its current calculation. Specifically, the calculation of a branch metric ($\gamma$) is the conditional probability that a particular transition occurred from one state to another state, assuming the starting state was the correct state, and given the received systematic and parity bits. According to known techniques, this calculation requires three operands: (1) the soft decision based on the previous iteration, (2) the probability the received systematic bit is a one or a zero, and (3) the probability the received parity bit is a one or a zero. The requirement of three operands in this repetitive calculation significantly increases the processing requirement of the MAP decoder, whether instantiated in hardware or as a software routine.

BRIEF DESCRIPTION OF THE DRAWINGS

The present invention is illustrated by way of example and is not limited by the accompanying figures, in which like references indicate similar elements, and in which:

FIG. 7 depicts a flow diagram of a method of decoding the output of the coder illustrated in FIG. 1; and FIG. 8 depicts a flow diagram of a step illustrated in FIG. 7.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
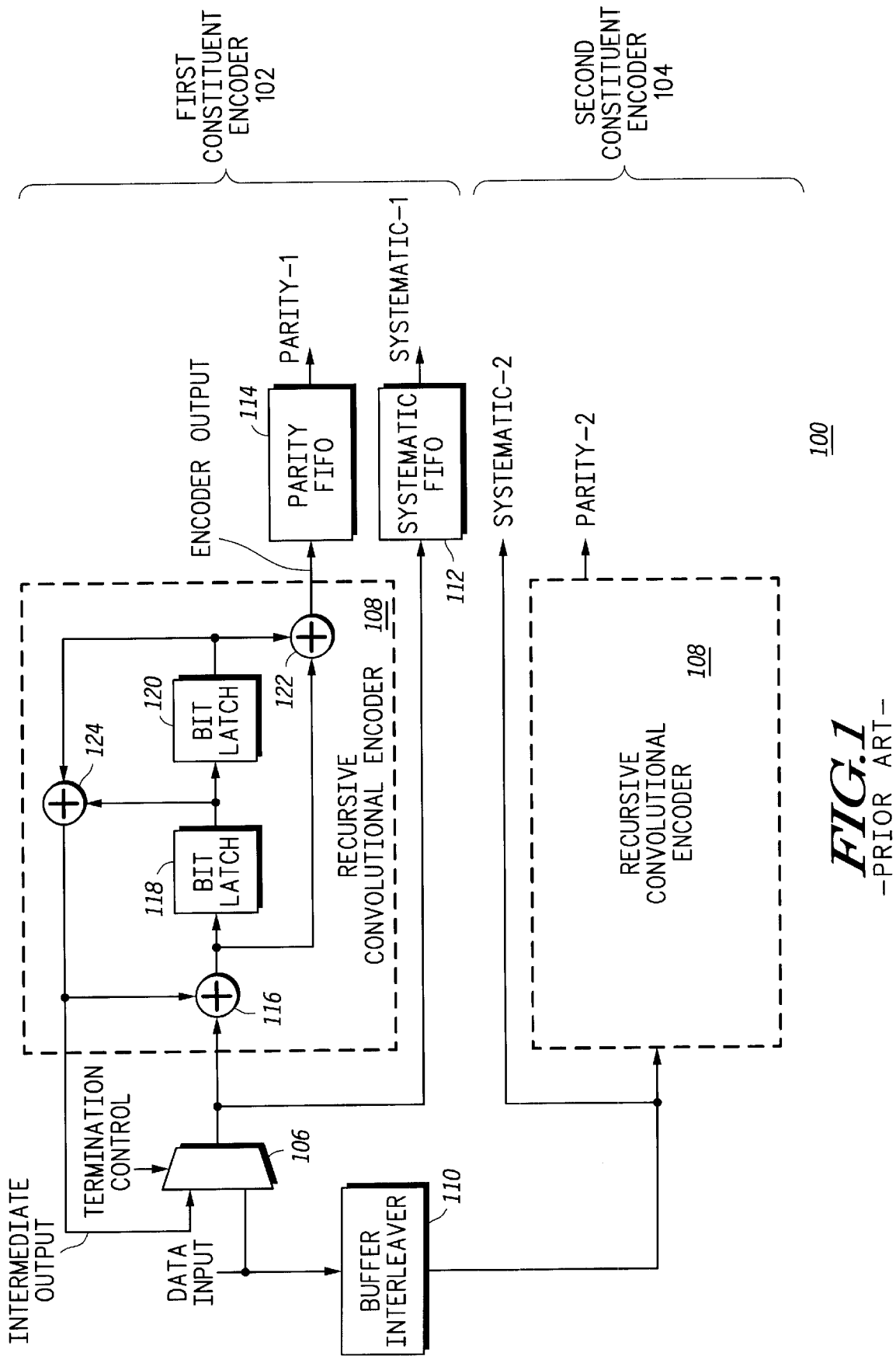
FIG. 1 depicts a block diagram of a parallel concatenated recursive systematic convolutional coder known in the art.

FIG. 7 depicts a flow diagram 700 of a method of decoding the output of the coder 100 illustrated in FIG. 1. In one embodiment of the present invention, the initial backwards state metrics ($\beta_{k=N}(m)$) are set to the final forwards state metrics (($\alpha_{k=N}(m)$), where the indices k and m correspond to a particular input data bit and to a particular encoder state, respectively, and where N is the number of data bits in a block of data. This assignment maintains the accuracy of the turbo coding scheme without requiring that either constituent encoder be terminated. The elimination of the terminating bits reduces the required bandwidth of the transmitting medium and the processing requirements of the decoder. However, the present invention is fully compatible with terminated trellis codes. In these cases, the decoder ignores the data associated with the terminating bits. In another embodiment of the present invention, the calculation of a branch metric ($\gamma_k(m)$) is modified to require only the prior soft decision and the current parity bit(s). The prior soft decision is modified to eliminate redundant information. This methodology eliminates one of the prior inputs in the branch metric calculation, significantly reducing the processing requirements of the MAP decoder, whether instantiated in hardware or as a software routine.

Figure 2:
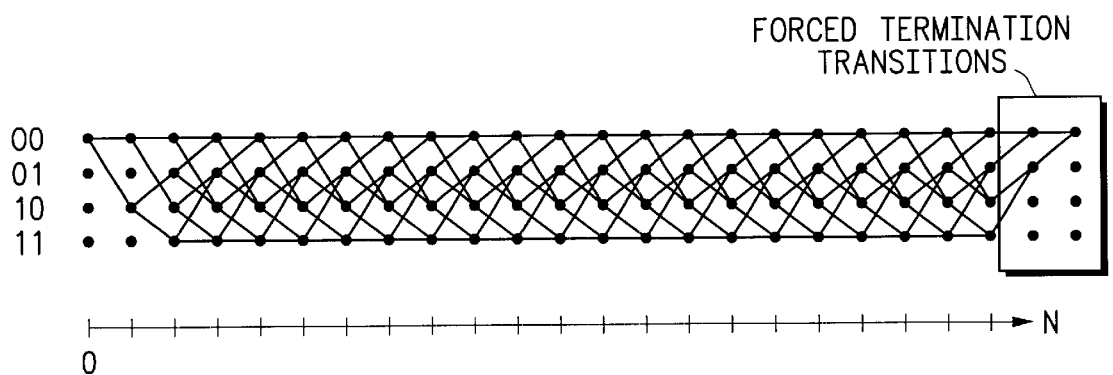
FIG. 2 depicts a graphical representation of a trellis decoding scheme useful in the explanation of the present invention.

FIG. 2 depicts a graphical representation of a trellis coding scheme useful in the explanation of the present invention. In a trellis encoding scheme, an N-bit data stream is encoded by coder 100 to produce a systematic bit, a first parity bit, and a second parity bit. The parity bits (whether sourced from the interleaved or non-interleaved recursive convolutional encoder) are a function of the prior state of the encoders and the current data bit. In the depicted example of FIG. 1, each recursive convolutional encoder generates one parity bit per input data bit. Furthermore, each recursive convolutional encoder can assume one of four states for each one of the N data bits. These four states correspond to the four binary permutations of the contents of bit registers 118 and 120. Specifically, the state 00 corresponds to the contents of registers 118 and 120 containing both zeros, the state 01 corresponds to the contents of registers 118 and 120 containing zero and one, respectively, etc. These four states extended over the range of N data bits form a regular array of nodes depicted in FIG. 2.

Each one of the four states depicted in FIG. 2 can only transition to two of the four states, depending upon the value shifted into bit latch 118. Specifically, if the initial state is 00, then the subsequent permitted states are 00 or 10. An input data bit of zero and an input data bit of one, respectively, generate these two transitions. If the initial state is 01, then the subsequent permitted states are 00 or 10. An input data bit of one and an input data bit of zero, respectively, generate these two transitions. if the initial state is 10, then the subsequent permitted states are state 01 or 11. An input data bit of one and an input data bit of zero, respectively, generate these two transitions. If the initial state is 11, then the subsequent permitted states are state 01 or 11. An input data bit of zero and an input data bit of one, respectively, generate these two transitions. These eight transitions, when projected onto the regular array of nodes, form the regular lattice like structure, commonly referred to as a trellis. As described above, the initial state of the recursive convolutional encoders are initialized to a known state, 00. Consequently, certain transitions are not permitted for the first two data bits. Also, in some embodiments of the present invention, the final state of the encoders may be forced to a known state. In these cases, the coder transmits additional bits that force the final state into the known state, again typically 00. This procedure is illustrated by the trellis structure terminating in a point at the right side of the FIG. 2 and labeled forced termination transitions.

The particular convolutional polynomials, the number of states generated by the polynomials, the number of bits shifted into the encoder, the number of parity bits output, etc. are all within the realm of one skilled in the art.

Figure 3:
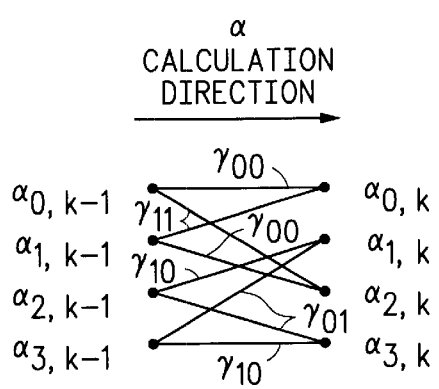
FIG. 3 depicts a graphical representation of a pair of adjacent trellis nodes scheme useful in the explanation of the calculation of forward state metrics.

FIG. 3 depicts a graphical representation of a pair of adjacent trellis nodes scheme useful in the explanation of the calculation of forward state metrics. The forward state metric, $\alpha_{0,k-1}$, corresponds to the probability that the data inputs received led to the $\alpha_0$ state (state 00) of the current node given the past inputs from the beginning of the trellis up to the current node. Likewise, $\alpha_{1,k-1}$ corresponds to the probability that the data inputs received led to the $\alpha_1$ state (state 01) of the current node. Forward state metrics $\alpha_{3,k-1}$ and $\alpha_{4,k-1}$ therefore correspond to the probabilities of being in states $\alpha_3$ (state 10) and $\alpha_4$ (state 11), respectively. In calculating the forward state metric, the next a value (e.g. $\alpha_{0,k}$), corresponds to the $\alpha$ value of the previous state and the probability that the transition from the previous state to the current state occurred (e.g. $\gamma_{00}$ where the first 0 indicates that a 0 systematic bit is expected, and the second 0 indicates a 0 parity bit is expected). Therefore, since $\alpha_{0,k}$ could have been transitioned into from either state $\alpha_{0,k-1}$ (state 00) or $\alpha_{1,k-1}$ (state 01), depending on whether a 1 or a 0 was received as the input bit, then $\alpha_{0,k}=(\alpha_{0,k-1})*(\gamma_{00})+(\alpha_{1,k-1})*(\gamma_{11})$. This can be seen in FIG. 3 by following the two branches that lead into the dot labeled $\alpha_{0,k}$. Note that the first half of the sum, $(\alpha_{0,k-1})*(\gamma_{00})$, refers to the probability of a 0 received as the input bit while the second half, $(\alpha_{1,k-1})*(\gamma_{11})$, refers to the probability that a 1 was received.

Figure 4:
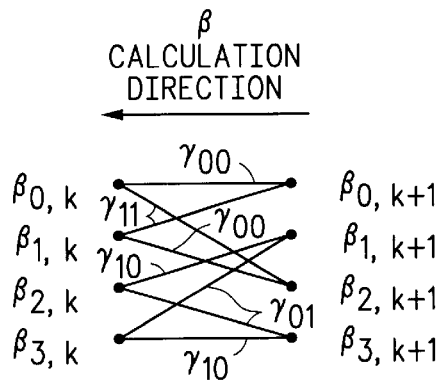
FIG. 4 depicts a graphical representation of a pair of adjacent trellis nodes scheme useful in the explanation of the calculation of backward state metrics.

FIG. 4 depicts a graphical representation of a pair of adjacent trellis nodes scheme useful in the explanation of the calculation of backward state metrics. The backward state metrics is analogous to the forward state metrics except that it is calculated starting from the end of the trellis to the beginning of the trellis. The backward state metric, $\beta_{0,k}$, corresponds to the probability that the data inputs received, when traced from the back end of the trellis to the front end, led to the $\beta_{0,k}$ state (state 00) of the current node given the "past inputs" from the end of the trellis up to the current node. In this case the "past inputs" refer to the values corresponding to the future time k+1 since this is a reverse order calculation. Note that the $\gamma$ values remain the same for the forward and backward metric calculation since the probability that the transition from one state to another occurred would be the same regardless of the direction of the calculations. For example, the probability that the current state of the node is $\beta_{1,k}$ based upon values calculated from the end of the trellis up to this point is the sum of the probability that the previous state was reached and the probability that the transition occurred. That is, $\beta_{1,k}=(\beta_{0,k+1})*(\gamma_{11})+(\beta_{2,k+1})*(\gamma_{00})$, where the first half refers to the probability that a 1 was received to cause that transition and the second half of the sum refers to the probability that a 0 was received to cause that transition.

Note that it is known in the art that the sums and products of probabilities can be converted to logarithms for ease of computation, where, for example, more complicated products can be converted into simpler sums. Therefore, the values of $\alpha$, $\beta$, and/or $\gamma$ may be in log format to simplify computations.

Figure 5:
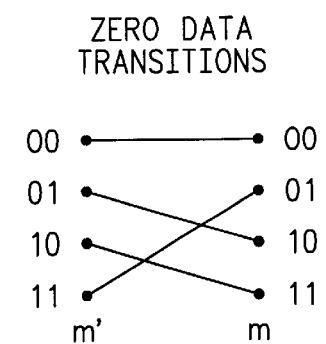
FIG. 5 depicts a graphical representation of zero data transitions between a pair of adjacent trellis nodes useful in the explanation of the calculation of branch metrics.

FIG. 5 depicts a graphical representation of zero data transitions between a pair of adjacent trellis nodes useful in the explanation of the calculation of the probability that a 0 was the input data bit at the encoder. The a posteriori probability of the data bit being a 0 (app0) is calculated based upon those transitions of the trellis corresponding to a 0 input to the encoder. These transitions are illustrated in FIG. 5. For example, if the current state (m') is 01, and a 0 input bit is received, the next state (m) would be a 10. Therefore, app0 can be calculated by summing the calculations of the probabilities corresponding to each transition caused by a 0 input bit using the values of $\alpha$, $\beta$, and $\gamma$. For example, $app0=(\alpha_{0,0}*\gamma_{00}*\beta_{0,0})+(\alpha_{0,1}*\gamma_{00}*\beta_{1,0})+(\alpha_{1,0}*\gamma_{01}*\beta_{1,1})+(\alpha_{1,1}*\gamma_{01}*\beta_{0,1})$, where app0 is the probability that a 0 was the input data bit of the encoder.

Figure 6:
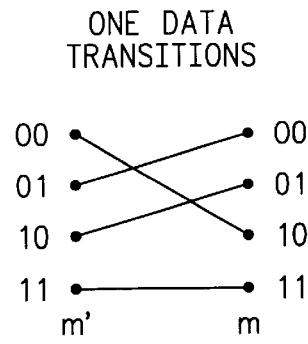
FIG. 6 depicts a graphical representation of one data transitions between a pair of adjacent trellis nodes useful in the explanation of the calculation of branch metrics.

FIG. 6 depicts a graphical representation of one data transitions between a pair of adjacent trellis nodes useful in the explanation of the calculation of the probability that a 1 was the input data bit at the encoder. The a posteriori probability of the data bit being a 1 (app1) is calculated based upon those transitions of the trellis corresponding to a 1 input to the encoder. These transitions are illustrated in FIG. 6. For example, if the current state (m') is 00, and a 1 input bit is received, the next state (m) would be a 10. Therefore, app1 can be calculated by summing the calculations of the probabilities corresponding to each transition caused by a 1 input bit using the values of $\alpha$, $\beta$, and $\gamma$. For example, $app1=(\alpha_{0,0}*\gamma_{11}*\beta_{1,0})+(\alpha_{0,1}*\gamma_{11}*\beta_{0,0})+(\alpha_{1,0}*\gamma_{10}*\beta_{0,1})+(\alpha_{1,1}*\gamma_{10}*\beta_{1,1})$, where app1 is the probability that a 1 was the input data bit at the encoder.

FIG. 7 depicts a flow diagram 700 of a method of decoding the output of the coder illustrated in FIG. 1. Flow diagram 700 may be performed in hardware, software, or a combination of both hardware and software. In block 702, arrays are used to store the received systematic values (S), parity 1 values (P1), parity 2 values (P2), and interleaved systematic values (IS). These are the values that have been transmitted by an encoder, such as the encoder of FIG. 1, over a channel and received and stored by the decoder. These values therefore include the noise collected as the values were transmitted over the channel. The received values (S, P1, P2, and IS) each correspond to a stream of bits that were transmitted by the encoder and can be stored in a variety of ways, such as in a two-dimensional array. In one embodiment, only P1, S1, and P2 are transmitted by the encoder since IS can be generated by the decoder since the interleaver function is known. This reduces the bandwidth needed to transmit the data; however, since less data is transmitted, less information is available to the decoder, since only three streams rather than four are sent.

Once the received values are stored, certain values are initialized before decoding the received values (block 704).

As described in reference to FIGS. 2–6 above, each transition of the trellis corresponds to a received value that is being decoded to determine whether a 1 or a 0 was transmitted by the encoder. As the decoder runs, it makes soft guesses as to these transmitted values. These soft guesses, $L_k$, are estimations based on the received values (e.g. S, P1, P2, and IS) and the calculated probabilities (e.g. $\alpha$, $\beta$, and $\gamma$), as will be described below in reference to FIG. 8. There is one $L_k$ value that corresponds to each transmitted bit. In one embodiment, these $L_k$ values are initially set to the received systematic bits, S, before continuing with the first MAP decoder, MAP1 (block 706).

Also in block 704, $\alpha_{0,0}$ through $\alpha_{0,J}$ are initialized to a known state where the first value in the subscript refers to the column of the trellis, and the second value refers to the state (i.e. $\alpha_{0,2}$ refers to the first column of the trellis since the trellis starts at column 0, and the 2 refers to the third state, e.g. state 10). By initializing the encoder to the known state of 00, the starting state of the trellis is known (see FIG. 2). For example, this would correspond to initializing bit latches 118 and 120 of first constituent encoder 102 of FIG. 1 to 0 before transmitting the data bits. Therefore, in one embodiment, $\alpha_{0,0}$–$\alpha_{0,J}$=1,0,0,0 since there is a 100% probability that we are in state 00.

Once the $L_k$ array and $\alpha_{0,0}$ through $\alpha_{0,J}$ are initialized, flow continues to block 706 where the first constituent encoding is decoded by MAP1. This decoding will be described in more detail in reference to FIG. 8. Once the first constituent encoding is decoded, an initial soft guess ($L_k$) is calculated for each received data (as will be seen with block 708). The result of block 706 is $\Lambda_k$ which is based on app0 and app1 (the probabilities that a 0 or a 1 was received). The value $\Lambda_k$ after block 706 is therefore an initial guess that is based on: (1) P1; (2) a feedback value of $L_k$ which is calculated from the output of the second decoder, MAP2 (block 712); and (3) additional guess work and calculations added by way of the first MAP decoder (MAP1) of block 706. Note that in the first iteration through block 706, the feedback value of $L_k$ is actually the initialized value (where $L_k$ was initialized to S); therefore, the first iteration uses this initialized array rather than the feedback values of $L_k$. Since $\Lambda_k$ was based in part on the feedback value of $L_k$ calculated from the output of MAP2, this redundant information must be removed in order to obtain a clean soft guess ($L_k$). This is performed in block 708.

For clarity, the value of $L_k$ calculated from the output of MAP1 may be referred to as $L_{kMAP1}$, and the value of $L_k$ calculated from the output of MAP2 (that is feedback to MAP1) may be referred to as $L_{kMAP2}$. However, only one array or storage area may be used for the $L_k$ values, since the $L_{kMAP2}$ values can simply replace the previous $L_{kMAP1}$ values, and likewise, the new $L_{kMAP1}$ values of a subsequent iteration will replace the current $L_{kMAP2}$ values. The addition of the MAP1 or MAP2 in the subscript simply differentiates which value of $L_k$ is currently being calculated or discussed. Likewise, the same would apply to $\Lambda_k$, i.e. $\Lambda_{kMAP1}$ and $\Lambda_{kMAP2}$.

In block 708, an extrinsic value containing only independent information is calculated to obtain $L_{kMAP1}$. In calculating $\Lambda_k$ within MAP1, the received systematic bit, S, is used in the calculations. In order to obtain $L_{kMAP1}$, this information needs to be removed from $\Lambda_k$. A scaled representation of the received systematic bit, based upon noise, estimations of noise variance, and normalizations as known in the art, is actually removed. Furthermore, since $L_{kMAP1}$ is also based in part on $L_{kMAP2}$, this information is also removed. In effect, one embodiment may express $L_k$ as:

$L_{kMAP1}=\Lambda_k-L_{kMAP2}+2*$scaled representation of S. (The 2 in this equation is a normalization factor that may be set depending on the needs of the system.) In one embodiment, the "scaled representation of S" becomes "2*S" once noise is taken into account. Therefore, the equation for $L_k$ can be expressed as $L_{kMAP1}=\Lambda_k-L_{kMAP2}+4*S$.

In order to simplify calculations, one embodiment of the present invention stores a modified value of $L_k$. In this embodiment, the stored value would be $(L_{kMAP1}-4*S)/2$ rather than just storing the $L_{kMAP1}$ calculated using the "$\Lambda_k-L_{kMAP2}+4*S$" equation. Therefore, throughout this application as well as in FIG. 7, the $L_k$ values refer to this modified version of $L_k$. That is, the modified $L_k=(L_{kMAP1}-4*S)/2$. This modified Lk can be described as including a statistical dependency. This statistical dependency aids in simplifying future calculations, as will be discussed below. Hence, the equation for $L_k$ in this embodiment which uses a modified $L_k$ can be expressed as $L_{kMAP1}=\Lambda_{kMAP1}/2-L_{kMAP2}+2*S$.

Once this soft guess is calculated, it is fed into a second constituent decoder (MAP2 of block 712) that works identically to MAP1 except that it uses the interleaved systematic bits (IS) rather that S, P2 rather than P1, and an interleaved version of $L_{kMAP1}$ rather than $L_{kMAP2}$. This second decoder is optional; however, it increases the accuracy of the overall decoding.

Block 710 applies the same interleaving function as was applied to the interleaved systematic bit that was transmitted over the channel by the encoder (such as the encoder and buffer interleaver 100 of FIG. 1). In this manner, both the $L_{kMAP1}$ values and the received interleaved systematic (IS) values will properly correspond to each other. As described above in reference to block 706, a new set of $\Lambda_k$ are calculated by MAP2 based on the new inputs that provide more information about the transmitted data being decoded (such as P2, IS, and the soft guesses, $L_k$'s, previously calculated by MAP1). Once the $\Lambda_k$ are calculated based on the probability of the data being a 0 or 1, they are de-interleaved based on the interleaving function that was used to interleave $L_k$ in block 710.

At decision diamond 716, more iterations through MAP1 and MAP2 may be performed, depending on the system constraints and the accuracy that is to be achieved. Generally, while more iterations require greater processing time, they allow for greater accuracy. In one embodiment, three iterations may be performed to achieve an acceptable accuracy level. If no more iterations are to be performed, then the $\Lambda_k$'s are post-processed (block 720) into 1's or 0's to produce the final decoded data bit stream from the decoder. However, if there are more iterations, then once again, as in block 708, the values of $L_k$ will be updated based on the $\Lambda_k$'s at the output of block 714 (these may be referred to as $\Lambda_{kMAP2}$). In this case, the same equation will be used to determine $L_{kMAP2}$ as was used to calculated $L_{kMAP1}$, above. Also, it is important to note that this $L_k$ still refers to the modified version that was described above in reference to block 708. Therefore, the equation for calculating the new values of $L_k$ can be expressed as $L_{kMAP2}=\Lambda_{kMAP2}/2-L_{kMAP1}30\ 2*S$.

By storing these modified values of $L_k$ (the "$(L_k-4*S)/2$") rather than storing just the unmodified $L_k$, fewer inputs are required to each MAP decoder (both MAP1 of block 706 and MAP2 of block 712). Since $L_k$ is initialized to S in block 704, and the modified version of $L_k$ already takes into account S as well, MAP1 and MAP2 do not require a third input for S. Prior art systems using two cascaded decoders similar to MAP1 and MAP2 had to use at least three inputs to receive the soft guesses (e.g. the unmodified versions of $L_k$), the parity bit (e.g. P1 for MAP1 and P2 for MAP2), and the systemic bits (e.g. the systemic bits for MAP1 and the interleaved systemic bits for MAP2). This increases both software and hardware complexity. Therefore, by modifying the calculations and storing methods pertaining to the soft guesses, improved performance is achieved. Furthermore, through the use of these mathematically modified soft guesses, calculations within the MAP decoders are further simplified, as will be explained in reference to FIG. 8 below.

FIG. 8 depicts a flow diagram of block 706 of FIG. 7. This represents MAP1 used to calculate $\Lambda_{kMAP1}$. This same flow, though, would apply to block 712, which represents MAP2, to calculate $\Lambda_{kMAP2}$. Therefore, FIG. 8 illustrates one embodiment of a MAP decoder that uses the modified values of $L_k$ described above. FIG. 8 begins with block 722 which calculates the γ's for the current transition (the details of these calculations will be described in more detail below). Therefore, if there are four states (as in FIG. 2), then there are 8 corresponding values of γ. In block 722, $\gamma_{k,0}$ through $\gamma_{k,C}$ correspond to these values where k refers to the particular bit within the sequence and C to the 8 possible transitions (e.g. if there were 8 states, there would exist 16 possible transitions). Once the γ's are calculated for the transition, the next α's can be calculated for the next column of the trellis (as was described in reference to FIG. 3). Decision diamond 726 repeats blocks 722 and 724 until a forward calculation through the trellis is complete. At this point, the α's are stored for each column of the trellis, and the γ's are stored for each transition of the trellis. The number of iterations through blocks 722 and 724 will therefore depend on the number of bits received by the decoder.

Once the a and γ calculations are complete, a backwards calculation through the trellis begins at block 728. The initial α's (for the first column of the trellis) are generally known since the encoder starts in a known state. However, when beginning a backward calculation from the end of trellis, the starting values of the β's are not known. One technique is to force the end of the trellis to a known state using forced termination transitions (see FIG. 2). However, this requires more bits to be transmitted and results in more complex processing. For example, if the trellis is forced to end at state 0 (state 00), then the initial β values are clearly $\beta_{N,0}-\beta_{N,3}=1, 0, 0, 0$, respectively, where N refers to the last column of the trellis. At this point, the probability of being in state 00 is 100% because the trellis was forced to this state. Another technique includes setting each node to 1/M where M refers to the number of states. Since we have no information as to which state is appropriate since we do not know the actual bits that were transmitted, each state is assigned the probability of 1/M. For example, each β value for the last column in FIG. 2 (without the forced termination transitions) would be 0.25. However, this increases processing time and decreases the accuracy of the β values as they are calculated backwards through the trellis. That is, it takes more calculations through the trellis before more reliable β values are achieved.

Therefore, one embodiment of the present invention initializes the starting β's to the ending α's. That is, for the last column of the trellis, N, $\beta_{N,0}-\beta_{N,3}=\alpha_{N,0}-\alpha_{N,3}$. Surprisingly, this produced no performance hits over the two methods described in the previous paragraph. Furthermore, this removes the need for the encoder to send terminations bits since this embodiment is able to calculate the metrics on unterminated trellises. (However, if termination bits are transmitted, they would be ignored by the decoder since they are not needed to decode the data stream.) Furthermore, this method of initialization improved the performance and accuracy of the backwards metric calculations. This method works especially well for small trellis sizes, therefore, one embodiment divides the trellis into trellis windows where each window is a subset of the trellis. Then for each window, a forward calculation is performed to calculate the $\alpha$'s and $\gamma$'s for that window, then the $\beta$'s are initialized to the ending $\alpha$'s, and a backward calculation is performed for the window. This allows for smaller block sizes to be processed at any given time.

The modified $L_k$'s, described above also allows for simplified $\gamma$ calculations. As was described above, app0 referred to the probability of the transmitted data being a 0 given all the inputs received by the decoder (i.e. the systematic bits, parity 1 bits, and parity 2 bits). Similarly, app1 refers to the probability of the transmitted data being a 1 given all the inputs received by the decoder. The probabilities app0 and app1 are then combined to calculate $\Lambda_k$. This value $\Lambda_k$ can also be written in terms of $\alpha$, $\beta$, and $\gamma$. In one embodiment, the value $\gamma$ can be described as the combination of four probabilities that are all multiplied together: (1) the probability of seeing a received systematic value, S, given that the corresponding input to the encoder had a value of i (where i can be a 0 or 1), that the corresponding ending state of the transition was at state m, and the corresponding starting state was at state m'; (2) the probability that the parity bit associated with the encoder output at this transition is at a certain value given that encoder input was i (where i can be a 0 or 1), the ending state was m, and starting state was m'; (3) the probability that encoder input is i (0 or 1) given that the ending state of the transition was m and the beginning state was m'; and (4) the probability that the ending state of the transition is m given that the starting state of the trellis at the beginning of the transition is m'.

In summary, the first probability described in the previous paragraph is associated with the received systematic input to the decoder (S). The second probability is associated with the parity bits, P1 and P2. The third probability can either be a 0 or 1 and it corresponds to whether this transition is an allowable transition on the trellis or not. This is due to the fact that not every state can be transitioned into from a starting state on the trellis, which can be seen in reference to FIGS. 2–4. That is, given a certain state, only certain transitions are allowed. The fourth probability is associated with $L_k$ which contains the extrinsic information from the previous decoder. Therefore, the $\gamma$'s are calculated based on S, P1, and $L_{kMAP2}$ for MAP1, and based on IS, P2, and $L_{kMAP1}$ for MAP2. Since the $\alpha$'s and $\beta$'s are calculated from the $\gamma$'s, and $\Lambda_k$ is then calculated based on the $\alpha$'s, $\gamma$'s, and $\beta$'s, the $\Lambda_k$ are calculated based on S, IS, P1, P2, and $L_k$.

One embodiment, in calculating $\gamma$'s in log format, uses the value for the probability that the decoder decision data bit is a 0 (pd0), and the probability that the decoder decision data bit is a 1 (pd1). This embodiment initializes pd0 to "$-\log(\exp(L_k[BIT])+1)$" for each BIT in the stream of bits transmitted over the channel, and pd1 to "$L_k[BIT]+pd0$." These initializations for each bit simplify the final $\gamma$ computations. The value ps0 refers to the probability that the received systematic bit, S, is a 0, and ps1 refers to the probability that S is a 1 (thus, with appropriate scaling, ps0=−ps1). Also, p0 is an intermediate value based upon pd0 and ps0 (p0=pd0+ps0) used in calculating the $\gamma$'s, and p1 is an intermediate value based upon pd1 and ps1 (p1=pd1+ps1). The value g0 is the probability of the received parity bit being a 0, and g1 is the probability of it being a 1, where g0=−g1. Using these values, the $\gamma$ for each transition (8 transitions total if there are 4 states) can be described as follows:

$\gamma[0]=\gamma_{00}=g0+p0$
$\gamma[1]=\gamma_{11}=g1+p1$
$\gamma[2]=\gamma_{11}=\gamma[1]$
$\gamma[3]=\gamma_{00}=\gamma[0]$
$\gamma[4]=\gamma_{10}=g0+p1$
$\gamma[5]=\gamma_{01}=g1+p0$
$\gamma[6]=\gamma_{01}=\gamma[5]$
$\gamma[7]=\gamma_{10}=\gamma[4]$ Using the fact that in this embodiment p1 is set to −p0 (p1=−p0), these equations can further be simplified into 4 basic $\gamma$ equations:

$\gamma[0]=g0+p0=A$
$\gamma[1]=-(g0+p0)=-A$
$\gamma[4]=g0-p0=B$
$\gamma[5]=-(g0-p0)=-B$ Therefore, if these $\gamma$ values are being calculated in hardware, they can be reduced to a total of two different calculations which can be computed in as little as one cycle of a 4 Arithmetic Logic Unit (ALU) machine. These equations can reduce the complexity of the decoder by at least two cycles per iteration over some existing methods. Also, since the $\beta$ calculations are greatly simplified once the $\gamma$ calculations are complete (as was described in reference to FIG. 4), the $\beta$'s need not be stored to calculate the $\Lambda_k$'s. As each $\beta$ is calculated in block 730 of FIG. 8, the $\Lambda_k$ and/or $L_k$ can be simultaneously calculated and stored, thus removing the need to store any $\beta$'s. This conserves memory space in any processing system. Alternatively, the $\beta$'s can be stored and upon calculating all the $\beta$'s, the $\Lambda_k$'s can then be calculated. Decision diamond 734 returns control to block 730 if more data to be decoded is present, and once the end of the trellis is reached (in this case, the end of the trellis is actually the starting column of the trellis since this is a backward calculation), $L_k$ can be calculated from $\Lambda_k$ (as in blocks 708 and 718).

In one embodiment, a flag may be used to signal whether the end of the trellis has been reached. If the flag indicates that there is more data to be processed (at decision diamond 716), then the $L_k$'s, may be processed immediately after calculating the $\Lambda_k$'s. That is, blocks 708 and 718 may be performed in block 732, if the $L_k$'s, are needed for further processing through the MAP decoders. However, if the flag indicates that the decoding is complete, then at block 732, the $L_k$'s, would not be calculated since block 720 directly post processes the $\Lambda_k$'s. Furthermore, the flag may be used to indicate whether blocks 718 and 732 should be combined while block 708 can always be performed with block 732 since the $L_k$'s are always needed as the input to MAP2 at block 712.

Therefore, it can be seen how storing a modified version of $L_k$ reduces processing requirements of the MAP decoders, whether instantiated in hardware or as a software routine, by eliminating an extra operand that is no longer needed (i.e. the received systematic bit or the scaled representation of the received systematic bit). The modified $L_k$'s, also allow for greater simplicity in calculating the branch metrics ($\gamma$'s) which saves hardware and/or software processing time. Furthermore, it can be seen how setting the starting $\beta$'s to the ending $\alpha$'s simplifies computations within the MAP decoders and provides improved performance.

An alternate embodiment, as was mentioned above, includes the technique of windowing. The embodiments described above, including the initialization of the $\beta$'s and the modified $L_k$'s, generally apply to windowing as well. Without windowing, sufficient memory must exist in order to store the data associated with the entire trellis (such as the $\alpha$'s and the $\beta$'s). This requires enough memory storage for the number of states times the length of the trellis, which may be a significant amount. However, in the case of windowing, the trellis is subdivided into smaller processing blocks which allows for processing of the trellis while requiring less memory storage.

The window size is selected such that it is sufficiently large to allow the $\alpha$'s to properly converge, otherwise the calculations will not lead to an accurate decoding. Therefore, one embodiment begins by calculating the α's and γ's as described above, using the modified $L_k$'s, for a window. Then within the window, the β's of the final column are initialized to the ending α's and then the β's are calculated back through the window. Once the current window has been processed, the next window is processed, where the next window may begin at the point along the trellis where the previous window ended. In this case, the starting α's of the next window (corresponding to the first column of the window) are initialized to the ending α's of the previous window. Alternate embodiments may implement this windowing technique by first calculating the β's and γ's starting from the end of each window, then initializing the starting α's to the ending β's, analogous to the technique described above, and then calculating the α's. Therefore, the order of the forward and backward calculations may be reversed.

Alternate windowing techniques may continue to calculate the α's along the trellis beyond the window's length before stopping and initializing the starting β's to the ending α's. In this embodiment, the β's corresponding to the final column of the window may be initialized to the ending α's that were calculated beyond the window's length. Any data taken beyond the window's length may be discarded when processing the window. Alternatively, the starting β's can be initialized to the ending α's at the point in the trellis where the last α's were calculated, beyond the window's length. Therefore, there will be extra α, β, and γ calculations performed outside the window that may be discarded. These calculations can also be performed in either order. That is, the forward and backward calculations may also be reversed in these embodiments. By calculating a certain amount beyond the window, improved starting β's may be achieved within each window.

Other alternate embodiments may include variations on the windowing techniques described above. For example, the window size may be varied after each pass through the MAP decoders where the first pass through the decoders may use a first window length and the second pass through the decoders may use a second, different window length. Subsequent passes may also use different window lengths. Also, the windows may be staggered prior to each pass through the MAP decoders. For example, through the first pass, the windows may be defined at a certain length and defined to start at the first column. However, during a subsequent pass through the decoders, the window length may be the same or different, but defined to start at some point other than the first column, thus staggering the processing windows as compared to the previous pass through the decoders.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Furthermore, it is known in the art that the calculations described herein can be performed in log format in order to simplify the mathematics involved.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for decoding a sequence of inputs, wherein the sequence includes a system input and a first parity input, comprising:

providing to said first constituent decoder a feedback input received from a second constituent decoder and the first parity input;

the first constituent decoder producing a first constituent decoder output based on the feedback input and the first parity input;

modifying the output of the first constituent decoder to include a statistical dependency on the system input, wherein the modified output of the first constituent decoder is independent of extrinsic information of the second constituent decoder;

interleaving the modified output of the first constituent decoder;

providing to said second constituent decoder the second parity input and the interleaved modified output of the first constituent decoder;

the second constituent decoder producing a second constituent decoder output; and modifying the output of the second constituent decoder to include a statistical dependency on the system input, wherein the modified output of the second constituent decoder is independent of extrinsic information of the first constituent decoder;

de-interleaving the modified output of the second constituent decoder; and providing the de-interleaved modified output of the second constituent decoder to the first constituent decoder, wherein the de-interleaved modified output of the second constituent decoder is the feedback input of the first constituent decoder; and processing the second constituent decoder output to produce decoded bits.

2. The method of claim 1, wherein the first constituent decoder is a MAP decoder.

3. The method of claim 1, wherein the first constituent decoder is a MAP decoder and the second constituent decoder is a MAP decoder.

4. The method of claim 1, wherein the system input is not a direct input to the first constituent decoder.

5. The method of claim 1, wherein the system input is not a direct input to the first constituent decoder and not a direct input to the second constituent decoder.

6. The method of claim 1, wherein the feedback input and the first parity input are the only two inputs to the first constituent decoder that are based on the sequence of inputs.

* * * * *